US006538859B1

(12) United States Patent
Gill (10) Patent No.: US 6,538,859 B1
(45) Date of Patent: Mar. 25, 2003

(54) GIANT MAGNETORESISTIVE SENSOR WITH AN AP-COUPLED LOW $H_K$ FREE LAYER

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 09/630,329

(22) Filed: Jul. 31, 2000

(51) Int. Cl.[7] ................................ G11B 5/33
(52) U.S. Cl. ................................ 360/324.12
(58) Field of Search ................ 360/324, 324.12, 360/324.11, 324.2

(56) References Cited

U.S. PATENT DOCUMENTS

| | | | |
|---|---|---|---|
| 5,341,261 A | 8/1994 | Dieny et al. | 360/113 |
| 5,408,377 A * | 4/1995 | Gurney et al. | 324/252 |
| 5,466,539 A | 11/1995 | Takayama | 428/611 |
| 5,549,978 A | 8/1996 | Iwasaki et al. | 428/692 |
| 5,777,542 A | 7/1998 | Ohsawa et al. | 338/32 |
| 5,796,560 A | 8/1998 | Saito et al. | 360/113 |
| 5,833,770 A * | 11/1998 | Ominato et al. | 148/305 |
| 5,849,422 A | 12/1998 | Hayashi | 428/611 |
| 5,949,622 A | 9/1999 | Kamiguchi et al. | 360/113 |
| 6,031,692 A * | 2/2000 | Kawawake et al. | 360/324.12 |
| 6,118,628 A * | 9/2000 | Sano et al. | 360/126 |
| 6,153,320 A * | 11/2000 | Parkin | 427/131 |
| 6,166,539 A * | 12/2000 | Dahlberg et al. | 324/252 |
| 6,306,266 B1 * | 10/2001 | Metin et al. | 204/192.11 |

FOREIGN PATENT DOCUMENTS

| | | |
|---|---|---|
| JP | 9-186375 | 7/1997 |
| JP | 10-92639 | 4/1998 |
| JP | 10-154311 | 6/1998 |

OTHER PUBLICATIONS

Hayakawa et al., "Microstructure and Magnetoresistance of Fe–Hf–O Films With High Electrical Resistivity", Journal of Magnetism and Magnetic Materials, 154 (1996) pp. 175–182.

* cited by examiner

Primary Examiner—William Korzuch
Assistant Examiner—Jennifer M Dolan
(74) Attorney, Agent, or Firm—William D. Gill (57) ABSTRACT

A spin valve (SV) magnetoresistive sensor is provided having an AP-pinned layer, an AP-coupled free layer and a non-magnetic electrically conductive spacer layer sandwiched between the AP-pinned layer and the free layer. The AP-pinned layer comprises first and second ferromagnetic layers separated by an antiparallel coupling (APC) layer. The AP-coupled free layer comprises a third ferromagnetic layer of Co—Fe adjacent to the spacer layer, a fourth ferromagnetic layer of Co—Fe—Hf—O and an APC layer sandwiched between the third and fourth ferromagnetic layers. The easy axis of the Co—Fe third ferromagnetic layer has a transverse orientation while the easy axis of the Co—Fe—Hf—O fourth ferromagnetic layer has a longitudinal orientation due to its higher thermal stability resulting in a low net intrinsic uniaxial anisotropy $H_k$ for the AP-coupled free layer. The Co—Fe—Hf—O material of the fourth ferromagnetic layer has high resistivity resulting in reduced sense current shunting by the free layer. In addition, the metal oxide material of the fourth ferromagnetic layer is known to cause specular scattering of electrons. The reduced sense current shunting and the specular scattering of electrons both contribute to improving the GMR coefficient of the SV sensor.

44 Claims, 5 Drawing Sheets

GIANT MAGNETORESISTIVE SENSOR WITH AN AP-COUPLED LOW $H_K$ FREE LAYER

CROSS REFERENCE TO RELATED APPLICATION

U.S. patent application Ser. No. 09/629,779, now U.S. Pat. No. 6,473,278, entitled GIANT MAGNETORESISTANCE SENSOR WITH A HIGH RESISTIVITY FREE LAYER, was filed on the same day, owned by a common assignee and having the same inventor as the present invention.

BACKGROUND OF THE INVENTION

1. Field of the Invention

This invention relates in general to giant magnetoresistive (GMR) sensors for reading information signals from a magnetic medium and, in particular, to a spin valve sensor having an antiparallel coupled free layer having a low intrinsic uniaxial anisotropy, and to magnetic storage systems that incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

Figure 1:
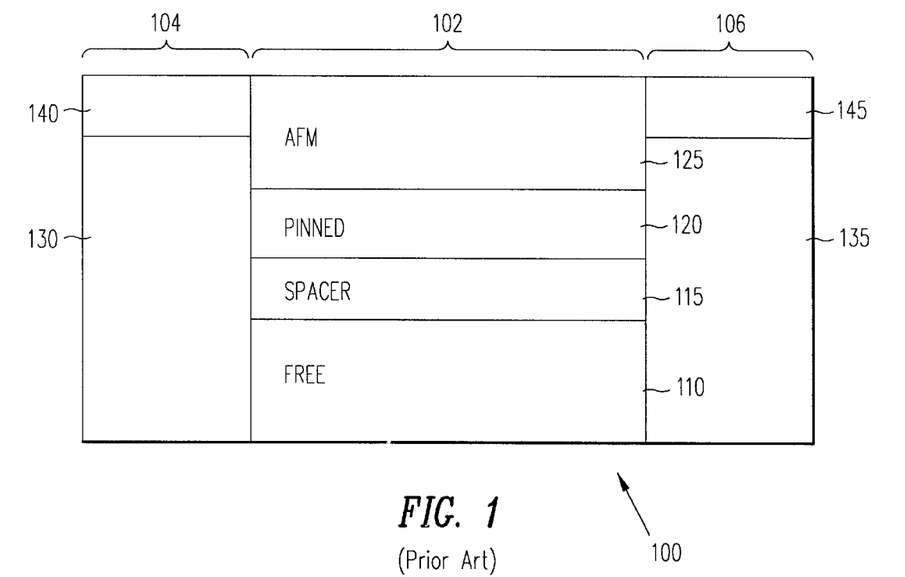
FIG. 1 is an air bearing surface view, not to scale, of a prior art SV sensor.

GMR sensors using only two layers of ferromagnetic material (e.g., Ni—Fe) separated by a layer of non-magnetic material (e.g., copper) are generally referred to as spin valve (SV) sensors manifesting the SV effect. FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Leads 140 and 145 formed in the end regions 104 and 106, respectively, provide electrical connections for sensing the resistance of SV sensor 100. IBM's U.S. Pat. No. 5,206,590 granted to Dieny et al., incorporated herein by reference, discloses a SV sensor operating on the basis of the GMR effect.

Another type of SV sensor is an antiparallel (AP)-pinned SV sensor. In AP-pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-pinned SV sensor provides improved exchange coupling of the antiferromagnetic (AFM) layer to the laminated pinned layer structure than is achieved with the pinned layer structure of the SV sensor of FIG. 1. This improved exchange coupling increases the stability of the AP-pinned SV sensor at high temperatures which allows the use of corrosion resistant and electrically insulating antiferromagnetic materials such as NiO for the AFM layer.

Figure 2:
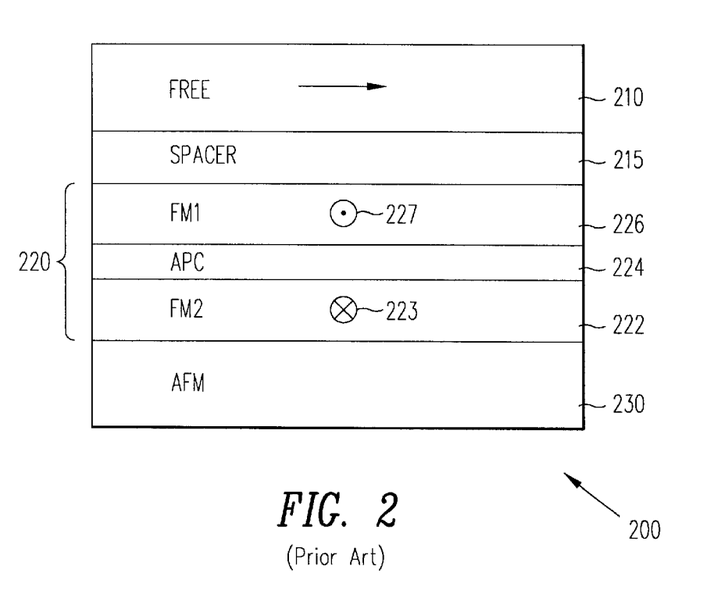
FIG. 2 is an air bearing surface view, not to scale, of a prior art AP-pinned SV sensor.

Referring to FIG. 2, an AP-pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 226 and a second ferromagnetic layer 222 separated by an antiparallel coupling (APC) layer 224 of nonmagnetic material (usually ruthenium (Ru)). The two ferromagnetic layers 226, 222 (FM1 and FM2) in the laminated AP-pinned layer structure 220 have their magnetization directions oriented antiparallel, as indicated by the arrows 227, 223 (arrows pointing out of and into the plane of the paper respectively).

As magnetic storage density increases in order to meet the demands of high storage capacity disk drives, it is increasingly important to increase the GMR coefficient of SV sensors in order to improve the sensitivity and signal-to-noise characteristics of the signal readback system and to decrease the thickness of the free layer to meet the higher areal density requirements. Sense current shunting around the spacer layer and the pinned layer and spacer layer interfaces with the spacer layer results in reduces GMR coefficient since most of the spin dependent scattering giving rise to the GMR effect occurs in this region. The free layer of SV sensors usually consists of Co—Fe and Ni—Fe layers. The Co—Fe is used to obtain a high GMR coefficient, and the Ni—Fe is added to achieve a free layer with soft magnetic properties. However, the Ni—Fe has a low electrical resistivity which contributes to sense current shunting resulting in a decrease of the GMR coefficient. Reduction of the free layer thickness for high areal density applications results in degradation of magnetic properties and a reduced GMR coefficient. The use of an antiparallel coupled structure for the free layer is a method to reduce the free layer magnetic thickness without degrading the magnetic properties and the GMR coefficient. However, the intrinsic uniaxial anisotropy $H_k$ of the free layer increases by antiparallel coupling making this structure unattractive for free layer application.

Therefore, there is a need for an improved antiparallel coupled free layer to reduce free layer thickness, reduce sense current shunting and to increase the GMR coefficient of a spin valve sensor while maintaining a very low value of $H_k$ for the free layer.

SUMMARY OF THE INVENTION

Accordingly, it is an object of the present invention to disclose a spin valve sensor having an antiparallel (AP)-coupled free layer with low intrinsic uniaxial anisotropy $H_k$.

It is another object of the present invention to disclose a spin valve sensor having a free layer of high electrical resistivity, soft ferromagnetic material.

It is yet another object of the present invention to disclose a spin valve sensor having an improved GMR coefficient due to reduced current shunting by the ferromagnetic free layer.

It is a further object of the present invention to disclose a spin valve sensor having an AP-coupled free layer comprising a third ferromagnetic layer of Co—Fe and a fourth ferromagnetic layer of Co—Fe—Hf—O separated by an antiferromagnetic coupling layer of ruthenium $(Ru)_x$.

In accordance with the principles of the present invention, there is disclosed a spin valve (SV) sensor having an AP-pinned layer, a laminated AP-coupled free layer and a non-magnetic electrically conductive spacer layer sandwiched between the AP-pinned layer and the free layer. The AP-pinned layer comprises first and second ferromagnetic layers separated by an antiparallel coupling (APC) layer. The AP-coupled free layer comprises a third ferromagnetic layer of Co—Fe adjacent to the spacer layer and a fourth ferromagnetic layer of Co—Fe—Hf—O separated from the third ferromagnetic layer by an antiparallel coupling (APC) layer. During the AFM anneal process step of the sensor, the easy axis of the Co—Fe layer becomes transverse while the easy axis of the Co—Fe—Hf—O remains longitudinal due to the higher thermal stability of this nano-crystalline material. The 90 degree angle between the easy axis of the Co—Fe layer and the the easy axis of the Co—Fe—Hf—O material results in a very low $H_k$ for the AP-coupled free layer. The Co—Fe—Hf—O material of the fourth ferromagnetic layer has high resistivity resulting in reduced sense current shunting by the free layer. In addition, the metal oxide material of the fourth ferromagnetic layer is known to cause specular scattering of electrons. The reduced sense current shunting and the specular scattering of electrons both contribute to improving the GMR coefficient of the SV sensor.

The above, as well as additional objects, features and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
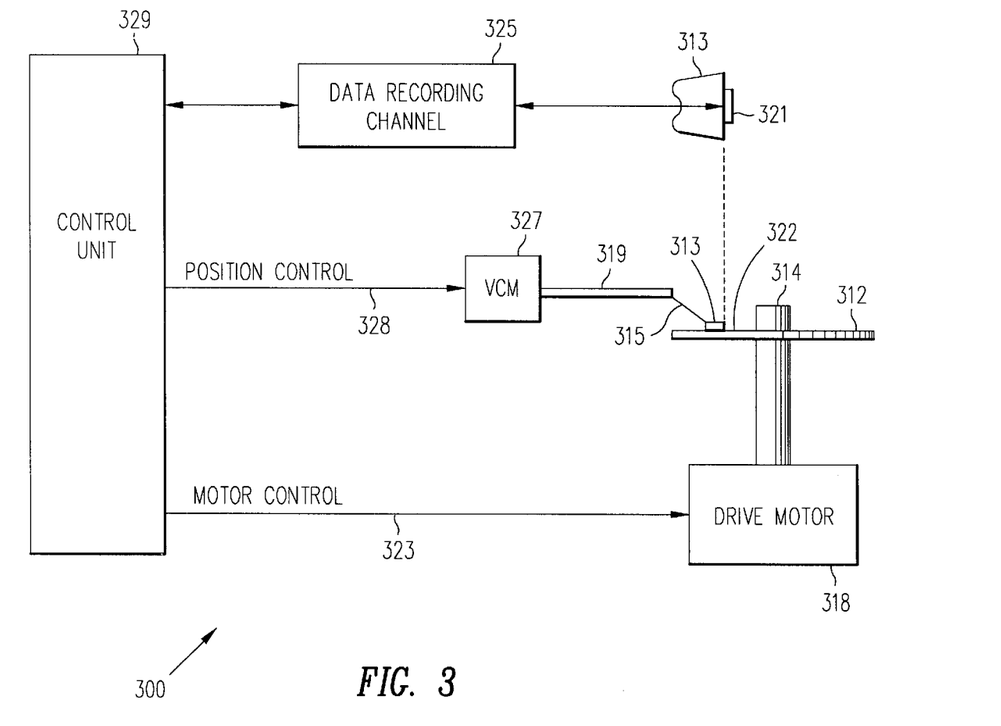
FIG. 3 is a simplified diagram of a magnetic recording disk drive system using the spin valve transistor sensor of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the SV sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325. Recording channel 325 may be a partial response maximum likelihood (PMRL) channel or a peak detect channel. The design and implementation of both channels are well known in the art and to persons skilled in the art. In the preferred embodiment, recording channel 325 is a PMRL channel.

The above description of a typical magnetic disk storage system, and the accompanying illustration of FIG. 3 are for representation purposes only. It should be apparent that disk storage systems may contain a large number of disks and actuator arms, and each actuator arm may support a number of sliders.

Figure 4:
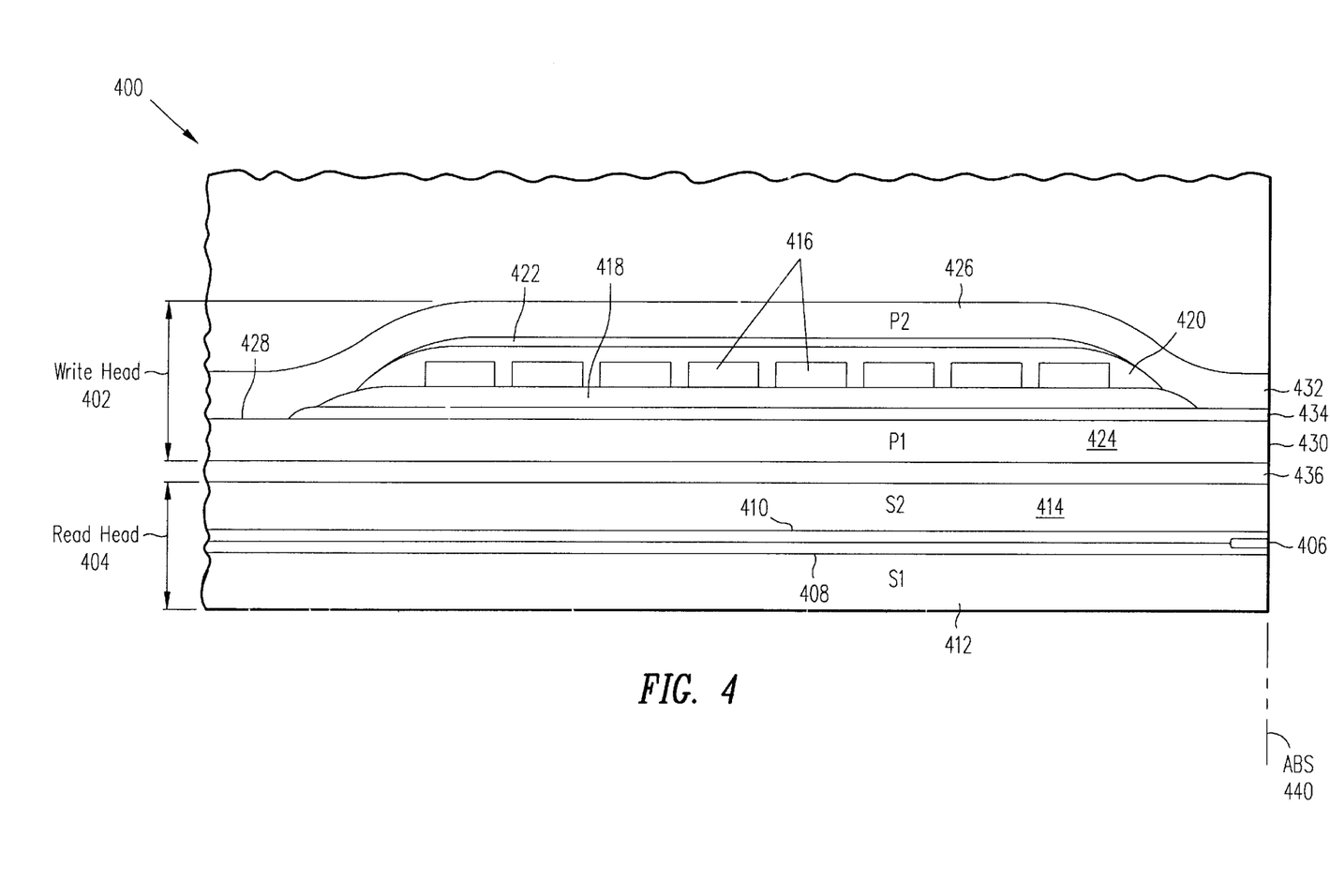
FIG. 4 is a vertical cross-section view, not to scale, of a "piggyback" read/write magnetic head.

FIG. 4 is a side cross-sectional elevation view of a "piggyback" magnetic read/write head 400, which includes a write head portion 402 and a read head portion 404, the read head portion employing a spin valve (SV) sensor 406 according to the present invention. The SV sensor 406 is sandwiched between nonmagnetic insulative first and second read gap layers 408 and 410, and the read gap layers are sandwiched between ferromagnetic first and second shield layers 412 and 414. In response to external magnetic fields, the resistance of the SV sensor 406 changes. A sense current $I_s$ conducted through the sensor causes these resistance changes to be manifested as potential changes. These potential changes are then processed as readback signals by the processing circuitry of the data recording channel 346 shown in FIG. 3.

The write head portion 402 of the magnetic read/write head 400 includes a coil layer 416 sandwiched between first and second insulation layers 418 and 420. A third insulation layer 522 may be employed for planarizing the head to eliminate ripples in the second insulation layer 420 caused by the coil layer 416. The first, second and third insulation layers are referred to in the art as an insulation stack. The coil layer 416 and the first, second and third insulation layers 418, 420 and 422 are sandwiched between first and second pole piece layers 424 and 426. The first and second pole piece layers 424 and 426 are magnetically coupled at a back gap 428 and have first and second pole tips 430 and 432 which are separated by a write gap layer 434 at the ABS 440. An insulation layer 436 is located between the second shield layer 414 and the first pole piece layer 424. Since the second shield layer 414 and the first pole piece layer 424 are separate layers this read/write head is known as a "piggyback" head.

Figure 5:
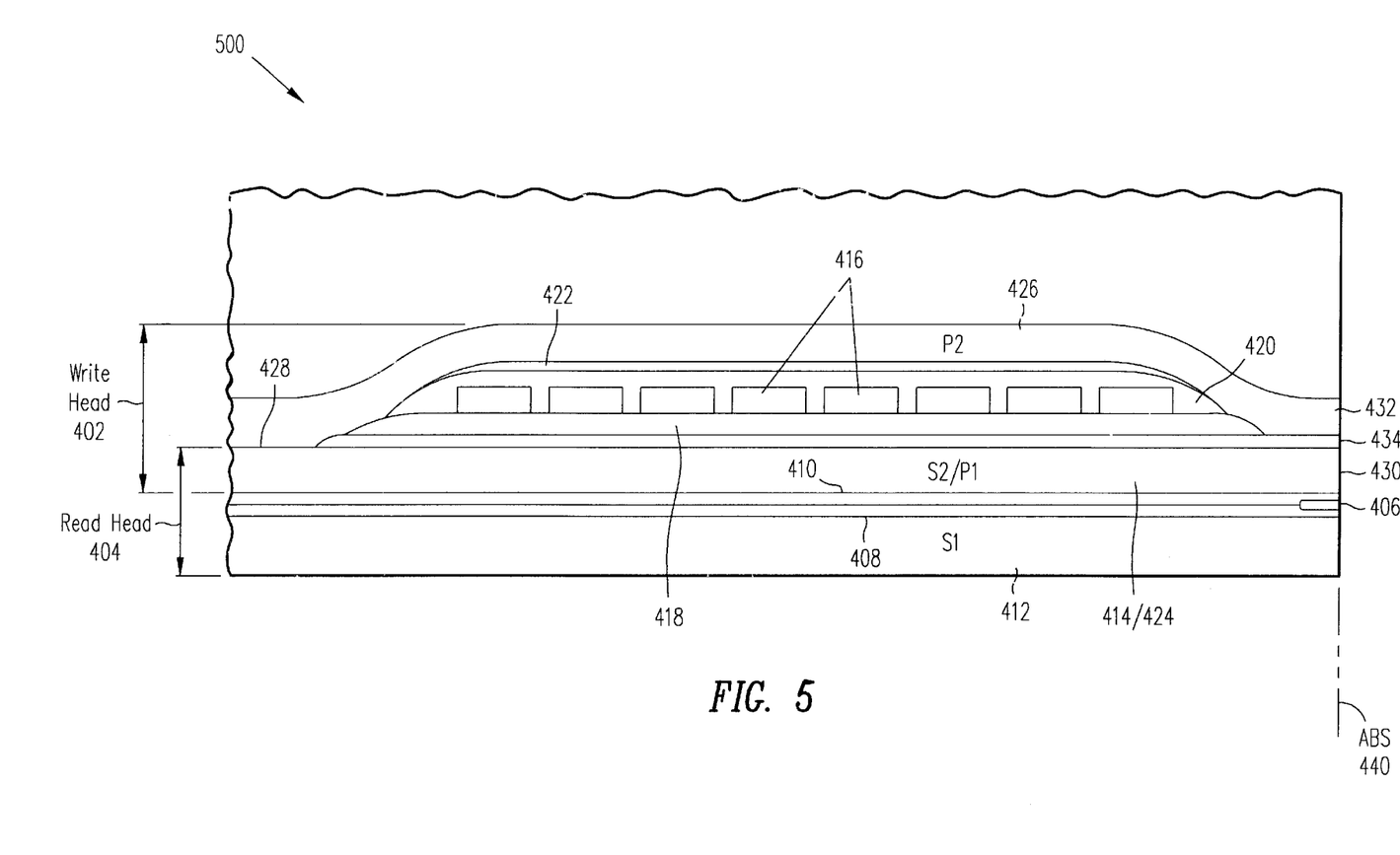
FIG. 5 is a vertical cross-section view, not to scale, of a "merged" read/write magnetic head.

FIG. 5 is the same as FIG. 4 except the second shield layer 514 and the first pole piece layer 524 are a common layer. This type of read/write head is known as a "merged" head 500. The insulation layer 436 of the piggyback head in FIG. 4 is omitted in the merged head 500 of FIG. 5.

Figure 6:
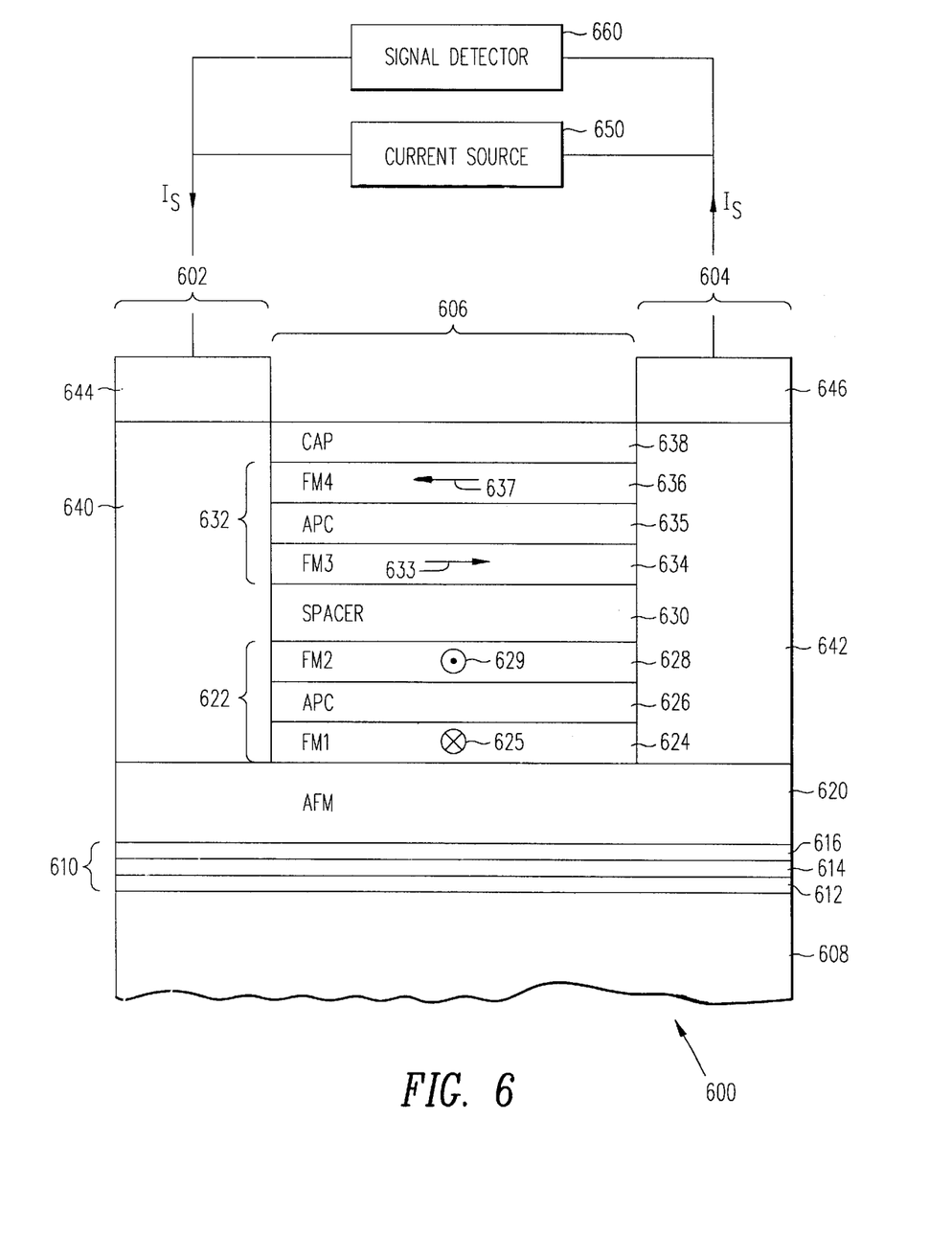
FIG. 6 is an air bearing surface view, not to scale, of an embodiment of the spin valve sensor of the present invention.

FIG. 6 shows an air bearing surface (ABS) view, not to scale, of an antiparallel (AP)-pinned spin valve (SV) sensor 600 according to an embodiment of the present invention. The SV sensor 600 comprises end regions 602 and 604 separated from each other by a central region 606. The substrate 608 can be any suitable substance, including glass, semiconductor material, or a ceramic material, such as alumina ($Al_2O_3$). The seed layer 610 is a layer deposited to modify the crystallographic texture or grain size of the subsequent layers, and may not be needed depending on the material of the subsequent layer. For the embodiment of the SV sensor 600, the seed layer 610 comprises a trilayer seed layer structure deposited on the substrate. First, second and third sublayers 612, 614 and 616 are sequentially deposited on the substrate 608. An antiferromagnetic (AFM) layer 620 is deposited over the third sublayer 612 to the thickness at which the desired exchange properties are achieved, typically 100–500 Å. A laminated AP-pinned layer 622 is formed on the AFM layer 620 in the central region 606. The AP-pinned layer 622 comprises a first ferromagnetic layer (FM1) 624, a second ferromagnetic layer (FM2) 628 and an antiparallel coupling (APC) layer 626 disposed between the EM1 layer 624 and the EM2 layer 628. The APC layer is formed of a nonmagnetic material, preferably ruthenium (Ru), that allows the FM1 layer 624 and the FM2 layer 628 to be strongly coupled together antiferromagnetically. A laminated AP-coupled free layer (free ferromagnetic layer) 632 including a third ferromagnetic layer (FM3) 634, a fourth ferromagnetic layer (FM4) 636 and an APC layer 635 disposed between the third and fourth ferromagnetic layers 634 and 636 is separated from the AP-pinned layer 622 by a nonmagnetic electrically conducting spacer layer 630. The magnetization of the free layer 632 is preferably parallel to the ABS in the absence of an external field as indicated by the arrows 633 and 637 representing the magnetizations of the AP-coupled third and fourth ferromagnetic layers 634 and 636, respectively. A cap layer 638, formed on the free layer 632, completes the central region 606 of the SV sensor 600.

In the present embodiment, the cap layer 638 is formed of tantalum (Ta). Alternatively, the cap layer 638 may be a bilayer cap layer formed of a first sublayer of copper (Cu) formed on the free layer 632 and a second sublayer of of tantalum (Ta) formed on the first sublayer of Cu. The presence of a Cu layer above the free layer is known to enhance the magnetoresistance of the SV sensor through a spin filter effect.

The SV sensor 600 further comprises bias layers 640 and 642 formed on the end regions 602 and 604, respectively, for providing a longitudinal bias field to the free layer 632 to ensure a single magnetic domain state in the free layer. Lead layers 644 and 646 are also deposited on the end regions 602 and 604, respectively, to provide electrical connections for the flow of a sensing current $I_s$ from a current source 650 to the SV sensor 600. A signal detector 660 which is electrically connected to leads 644 and 646 senses the change in resistance due to changes induced in the free layer 632 by the external magnetic field (e.g., field generated by a data bit stored on a disk). The external magnetic field acts to rotate the direction of magnetization of the free layer 632 relative to the direction of magnetization of the pinned layer 622 which is preferably pinned perpendicular to the ABS. The signal detector 660 preferably comprises a partial response maximum likelihood (PRML) recording channel for processing the signal detected by SV sensor 600. Alternatively, a peak detect channel or a maximum likelihood channel (e.g., 1,7 ML) may be used. The design and implementation of the aforementioned channels are known to those skilled in the art. The signal detector 660 also includes other supporting circuitries such as a preamplifier (electrically placed between the sensor and the channel) for conditioning the sensed resistance changes as is known to those skilled in the art.

The SV sensor 600 is fabricated in a magnetron sputtering or an ion beam sputtering system to sequentially deposit the multilayer structure shown in FIG. 6. The sputter deposition process is carried out in the presence of a longitudinal magnetic field of about 40 Oe. The seed layer 610 is formed on the substrate 608 by sequentially depositing the first sublayer 612 of $Al_2O_3$ having a thickness of about 30 Å, the second sublayer 614 of NiMnO having a thickness of about 30 Å and the third sublayer 616 of tantalum (Ta) having a thickness of about 35 Å. The AFM layer 620 formed of Pt—Mn having a thickness of about 200 Å is deposited on the third sublayer 616 of the seed layer 610.

The AP-pinned layer 622, the spacer layer 630, the laminated AP-coupled free layer 632 and the cap layer 638 are sequentially deposited on the AFM layer 620 in the central region 606. The FM1 layer 624 of Co—Fe having a thickness of about 17 Å is deposited on the AFM layer 620.

The APC layer 626 of ruthenium having a thickness of about 8 Å is deposited on the FM1 layer 624. The FM2 layer 628 of Co—Fe having a thickness of about 26 Å is deposited on the APC layer 626.

The nonmagnetic conducting spacer layer 630 is formed of copper (Cu) having a thickness of about 21 Å deposited on the EM2 layer 628. Alternatively, the spacer layer 630 may be formed of silver (Ag), gold (Au) or of alloys of Cu, Ag and Au. The laminated AP-coupled free layer 632 comprises the FM3 layer 634 of Co—Fe having a thickness in the range of 10–20 Å, preferably 15 Å, deposited on the spacer layer 630, the APC layer 635 of ruthenium having a thickness of about 8 Å deposited on the FM3 layer 634, and the FM4 layer 636 of Co—Fe—Hf—O having a thickness in the range of 10–20 Å, preferably 15 Å, deposited on the APC layer 635. The cap layer 638 is formed of Ta having a thickness of about 50 Å deposited on the FM4 layer 638 of the free layer 632.

After the deposition of the central portion 606 is completed, the sensor is annealed in the presence of a magnetic field of about 800 Oe oriented in the transverse direction to the ABS and is then cooled while still in the magnetic field to set the exchange coupling of the AFM layer 620 with the laminated AP-pinned layer 622 transverse to the ABS. The FM1 layer 624 has a surface which interfaces with a surface of the AFM layer 620 so that the AFM layer pins the magnetic moment 625 (represented in FIG. 6 by the tail of an arrow pointing into the plane of the paper) of the FM1 layer 624 in a direction perpendicular to and away from the ABS. The magnetization of the FM1 layer 624 is pinned in this direction by exchange coupling with the AFM layer 620. The APC layer 626 is very thin (about 8 Å) which allows an antiferromagnetic exchange coupling between the FM1 layer 624 and the FM2 layer 628. Accordingly, the magnetization 629 (represented by the head of an arrow pointing out of the plane of the paper) of the FM2 layer 628 is directed in an opposite direction to the magnetization 625 of the FM1 layer 624, namely perpendicular to and towards the ABS. Alternatively, the magnetization 625 of the FM1 layer 624 may be set in an opposite direction (perpendicular to and away from the ABS) so that the magnetization 625 points out of the plane of the paper. The magnetization 629 of the FM2 layer 628 will then point into the plane of the paper due to the antiparallel coupling across the APC layer 626.

A novel feature of the present invention is the use of Co—Fe—Hf—O to form the FM4 layer 636 of the AP-coupled free layer 632. The Co—Fe—Hf—O material is known to have high thermal stability due to its nano-crystalline structure with the result that the transverse anneal process used to set the exchange coupling of the AFM layer 620 of Pt—Mn with the AP-pinned layer 622 transverse to the ABS will not cause rotation of the magnetic easy axis of the Co—Fe—Hf—O material of the FM4 layer 636 from its longitudinal orientation. However, the transverse anneal process causes the magnetic easy axis of the lower thermal stability Co—Fe material of the FM3 layer 634 to become transverse. As a result, the net intrinsic uniaxial anisotropy $H_k$ of the FM3 and FM4 layers of the AP-coupled free layer 632 will be reduced. The ferromagnetic Co—Fe—Hf—O material is known to have a very high electrical resistivity (>400 $\mu$ohm-cm) and to possess soft magnetic properties (coercivity $H_c$<5 Oe, and intrinsic uniaxial anisotropy $H_k$<10 Oe). The soft magnetic properties are important in allowing the free layer 632 to rotate freely in response to an signal magnetic field. The high resistance of the FM4 layer 636 reduces sense current flow through this sublayer of the free layer 632 resulting in a increase of the sense current flow in the spacer layer 630 and the ferromagnetic layers interfacing the spacer layer where the spin dependent scattering processes that result in the GMR effect are most effective. In addition to high resistivity, the Co—Fe—Hf—O material is a metal oxide known to cause specular reflection of electrons. Electrons are specularly reflected by the metal oxide material back toward the free layer where they continue to add to the GMR effect. The combined effects of reduced sense current shunting and specular reflection of electrons scattered into the metal oxide layer will result in an increased GMR coefficient for the spin valve sensor 600.

The high electrical resistivity and low uniaxial anisotropy of the Co—Fe—Hf—O material is due to a nano-grain crystalline structure. The composition range of the desired material may be expressed as $(Co_a—Fe_b)_x—Hf_y—O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, x+y+z=100% and a+b=100%. The preferred composition is $(Co_{90}—Fe_{10})_{60}—Hf_{10}—O_{30}$.

The FM3 layer 634 of the laminated free layer 632 is made of Co—Fe having a composition range expressed as $Co_a—Fe_b$ in atomic percent, where $70\% \leq a \leq 95\%$, $5\% \leq b \leq 30\%$, and a+b=100%. The preferred composition is $Co_{90}—Fe_{10}$.

It will be apparent to those skilled in the art that the AP-coupled free layer of the present invention may be used as the free layer in a magnetic tunnel junction (MTJ) sensor magnetoresistive device to obtain the advantages of reduced free layer magnetic thickness derived from AP-coupling and the increased sensitivity due to the present free layer materials and structure.

While the present invention has been particularly shown and described with reference to the preferred embodiment, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A spin valve (SV) magnetoresistive sensor, comprising:
   an antiferromagnetic (AFM) layer;
   a pinned layer adjacent to said AFM layer, said AFM layer fixing a magnetization direction of said pinned layer;
   an antiparallel (AP)-coupled free layer comprising;
      a third ferromagnetic layer;
      a fourth ferromagnetic layer of material having an electrical resistivity greater than 400 $\mu$ohm-cm; and
      an antiparallel coupling layer disposed between said third and fourth ferromagnetic layers; and
   a spacer layer of nonmagnetic electrically conductive material disposed between said pinned layer and said third ferromagnetic layer.

2. The SV magnetoresistive sensor as recited in claim 1 wherein said third ferromagnetic layer is made of Co—Fe.

3. The SV magnetoresistive sensor as recited in claim 1 wherein said third ferromagnetic layer is made of $Co_a—Fe_b$ in atomic percent, where $70\% \leq a \leq 95\%$, $5\% \leq b \leq 30\%$, and a+b=100%.

4. The SV magnetoresistive sensor as recited in claim 1 wherein said APC layer is made of ruthenium.

5. The SV magnetoresistive sensor as recited in claim 1 wherein the magnetic easy axis of said third ferromagnetic layer has a substantially perpendicular orientation with respect to the magnetic easy axis of said fourth ferromagnetic layer.

6. The SV magnetoresistive sensor as recited in claim 1 wherein said AFM layer is made of Pt—Mn.

7. The SV magnetoresistive sensor as recited in claim 1 wherein said pinned layer further comprises:
   a first ferromagnetic layer adjacent to said AFM layer;
   a second ferromagnetic layer adjacent to said spacer layer; and
   an antiparallel coupling (APC) layer disposed between said first ferromagnetic layer and said second ferromagnetic layer.

8. The SV magnetoresistive sensor as recited in claim 7 wherein said third ferromagnetic layer is made of Co—Fe.

9. The SV magnetoresistive sensor as recited in claim 7 wherein said third ferromagnetic layer is made of $Co_a$—$Fe_b$ in atomic percent, where $70\% \leq a \leq 95\%$, $5\% \leq b \leq 30\%$, and $a+b=100\%$.

10. The SV magnetoresistive sensor as recited in claim 7 wherein the fourth ferromagnetic layer has the same thickness as the third ferromagnetic layer.

11. The SV magnetoresistive sensor as recited in claim 7 wherein said AFM layer is made of Pt—Mn.

12. A spin valve (SV) magnetoresistive sensor, comprising:
   an antiferromagnetic (AFM) layer;
   a pinned layer adjacent to said AFM layer, said AFM layer fixing a magnetization direction of said pinned layer;
   an antiparallel (AP)-coupled free layer comprising;
      a third ferromagnetic layer;
      a fourth ferromagnetic layer of high electrical resistivity material made of Co—Fe—Hf—O; and
      an antiparallel coupling layer disposed between said third and fourth ferromagnetic layers; and
   a spacer layer of nonmagnetic electrically conductive material disposed between said pinned layer and said third ferromagnetic layer.

13. The SV magnetoresistive sensor as recited in claim 12 wherein said fourth ferromagnetic layer of Co—Fe—Hf—O has a composition of $(Co_{90}$—$Fe_{10})_{60}$—$Hf_{10}$—$O_{30}$ in atomic percent.

14. The SV magnetoresistive sensor as recited in claim 12 wherein said fourth ferromagnetic layer of Co—Fe—Hf—O has a composition of $(Co_a$—$Fe_b)_x$—$Hf_y$—$O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, $x+y+z=100\%$ and $a+b=100\%$.

15. A spin valve (SV) magnetoresistive sensor, comprising:
   an antiferromagnetic (AFM) layer;
   an antiparallel (AP)-pinned layer adjacent to said AFM layer, said AP-pinned layer comprising;
      a first ferromagnetic layer adjacent to said AFM layer;
      a second ferromagnetic layer; and
      an antiparallel coupling (APC) layer disposed between said first ferromagnetic layer and said second ferromagnetic layer;
   an AP-coupled free layer comprising;
      a third ferromagnetic layer;
      a fourth ferromagnetic layer of high resistivity material made of $(Co_{90}$—$Fe_{10})_{60}$—$Hf_{10}$—$O_{30}$; and
      an APC layer disposed between said third and fourth ferromagnetic layers; and
   a spacer layer of nonmagnetic electrically conductive material disposed between said second ferromagnetic layer and said third ferromagnetic layer.

16. A spin valve (SV) magnetoresistive sensor, comprising:
   an antiferromagnetic (AFM) layer;
   an antiparallel (AP)-pinned layer adjacent to said AFM layer, said AP-pinned layer comprising;
      a first ferromagnetic layer adjacent to said AFM layer;
      a second ferromagnetic layer; and
      an antiparallel coupling (APC) layer disposed between said first ferromagnetic layer and said second ferromagnetic layer;
   an AP-coupled free layer comprising;
      a third ferromagnetic layer;
      a fourth ferromagnetic layer of high resistivity material made of $(Co_a$—$Fe_b)_x$—$Hf_y$—$O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, $x+y+z=100\%$ and $a+b=100\%$; and
      an APC layer disposed between said third and fourth ferromagnetic layers; and
   a spacer layer of nonmagnetic electrically conductive material disposed between said second ferromagnetic layer and said third ferromagnetic layer.

17. A spin valve (SV) magnetoresistive sensor, comprising:
   an antiferromagnetic (AFM) layer;
   an antiparallel (AP)-pinned layer adjacent to said AFM layer, said AP-pinned layer comprising;
      a first ferromagnetic layer adjacent to said AFM layer;
      a second ferromagnetic layer; and
      an antiparallel coupling (APC) layer disposed between said first ferromagnetic layer and said second ferromagnetic layer;
   an AP-coupled free layer comprising;
      a third ferromagnetic layer;
      a fourth ferromagnetic layer of material having an electrical resistivity greater than 400 $\mu$ohm-cm; and
      an APC layer disposed between said third and fourth ferromagnetic layers; and
   a spacer layer of nonmagnetic electrically conductive material disposed between said second ferromagnetic layer and said third ferromagnetic layer.

18. The SV magnetoresistive sensor as recited in claim 17 wherein said third ferromagnetic layer is made of Co—Fe.

19. The SV magnetoresistive sensor as recited in claim 17 wherein said third ferromagnetic layer is made of $Co_a$—$Fe_b$ in atomic percent, where $70\% \leq a \leq 95\%$, $5\% \leq b \leq 30\%$, and $a+b=100\%$.

20. The SV magnetoresistive sensor as recited in claim 17 wherein the fourth ferromagnetic layer has the same thickness as the third ferromagnetic layer.

21. The SV magnetoresistive sensor as recited in claim 17 wherein the magnetic easy axis of said third ferromagnetic layer has a substantially perpendicular orientation with respect to the magnetic easy axis of said fourth ferromagnetic layer.

22. The SV magnetoresistive sensor as recited in claim 17 wherein said AFM layer is made of Pt—Mn.

23. The SV magnetoresistive sensor as recited in claim 17 wherein said spacer layer is made of copper (Cu).

24. A spin valve (SV) magnetoresistive sensor, comprising:
   an antiferromagnetic (AFM) layer;
   an antiparallel (AP)-pinned layer adjacent to said AFM layer, said AP-pinned layer comprising;
      a first ferromagnetic layer adjacent to said AFM layer;

a second ferromagnetic layer; and
an antiparallel coupling (APC) layer disposed between said first ferromagnetic layer and said second ferromagnetic layer;
an AP-coupled free layer comprising;
a third ferromagnetic layer;
a fourth ferromagnetic layer of high electrical resistivity material made of Co—Fe—Hf—O; and
an APC layer disposed between said third and fourth ferromagnetic layers; and
a spacer layer of nonmagnetic electrically conductive material disposed between said second ferromagnetic layer and said third ferromagnetic layer.

25. The SV magnetoresistive sensor as recited in claim 24 wherein said fourth ferromagnetic layer of Co—Fe—Hf—O has a composition of $(Co_{90}—Fe_{10})_{60}—Hf_{10}—O_{30}$ in atomic percent.

26. The SV magnetoresistive sensor as recited in claim 24 wherein said fourth ferromagnetic layer of Co—Fe—Hf—O has a composition of $(Co_a—Fe_b)_x—Hf_y—O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, x+y+z=100% and a+b=100%.

27. A magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS); the insulation stack being sandwiched between the first and second pole piece layers; and
a write gap layer sandwiched between the pole tips of the first and second pole piece layers and forming a portion of the ABS;
a read head including:
a spin valve (SV) magnetoresistive sensor disposed between first and second shield layers, the SV magnetoresistive sensor comprising:
an antiferromagnetic (AFM) layer;
an antiparallel (AP)-pinned layer adjacent to said AFM layer, said AP-pinned layer comprising;
a first ferromagnetic layer adjacent to said AFM layer;
a second ferromagnetic layer; and
an antiparallel coupling (APC) layer disposed between said first ferromagnetic layer and said second ferromagnetic layer;
an AP-coupled free layer comprising;
a third ferromagnetic layer;
a fourth ferromagnetic layer of material having an electrical resistivity greater than 400 µohm-cm; and
an APC layer disposed between said third and fourth ferromagnetic layers; and
a spacer layer of nonmagnetic electrically conductive material disposed between said second ferromagnetic layer and said third ferromagnetic layer; and
an insulation layer disposed between the second shield layer of the read head and the first pole piece layer of the write head.

28. The magnetic read/write head as recited in claim 27 wherein said third ferromagnetic layer is made of Co—Fe.

29. The magnetic read/write head as recited in claim 27 wherein said third ferromagnetic layer is made of $Co_a—Fe_b$ in atomic percent, where $70\% \leq a \leq 95\%$, $5\% \leq b \leq 30\%$, and a+b=100%.

30. The magnetic read/write head as recited in claim 27 wherein the fourth ferromagnetic layer has the same thickness as the third ferromagnetic layer.

31. The magnetic read/write head as recited in claim 27 wherein said AFM layer is made of Pt—Mn.

32. The magnetic read/write head as recited in claim 27 wherein said spacer layer is made of copper (Cu).

33. A magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS); the insulation stack being sandwiched between the first and second pole piece layers; and
a write gap layer sandwiched between the pole tips of the first and second pole piece layers and forming a portion of the ABS;
a read head including:
a spin valve (SV) magnetoresistive sensor disposed between first and second shield layers, the SV magnetoresistive sensor comprising:
an antiferromagnetic (AFM) layer;
an antiparallel (AP)-pinned layer adjacent to said AFM layer, said AP-pinned layer comprising;
a first ferromagnetic layer adjacent to said AFM layer;
a second ferromagnetic layer; and
an antiparallel coupling (APC) layer disposed between said first ferromagnetic layer and said second ferromagnetic layer;
an AP-coupled free layer comprising;
a third ferromagnetic layer;
a fourth ferromagnetic layer of high electrical resistivity material made of Co—Fe—Hf—O; and
an APC layer disposed between said third and fourth ferromagnetic layers; and
a spacer layer of nonmagnetic electrically conductive material disposed between said second ferromagnetic layer and said third ferromagnetic layer; and
an insulation layer disposed between the second shield layer of the read head and the first pole piece layer of the write head.

34. The magnetic read/write head as recited in claim 33 wherein said fourth ferromagnetic layer of Co—Fe—Hf—O has a composition of $(Co_{90}—Fe_{10})_{60}—Hf_{10}—O_{30}$ in atomic percent.

35. The magnetic read/write head as recited in claim 33 wherein said fourth ferromagnetic layer of Co—Fe—Hf—O has a composition of $(Co_a—Fe_b)_x—Hf_y—O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, x+y+z=100% and a+b=100%.

36. A disk drive system comprising:
a magnetic recording disk;
a magnetic read/write head for magnetically recording data on the magnetic recording disk and for sensing magnetically recorded data on the magnetic recording disk, said magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS); the insulation stack being sandwiched between the first and second pole piece layers; and a write gap layer sandwiched between the pole tips of the first and second pole piece layers and forming a portion of the ABS;

a read head including:

a spin valve (SV) magnetoresistive sensor disposed between first and second shield layers, the SV magnetoresistive sensor comprising:

an antiferromagnetic (AFM) layer;

an antiparallel (AP)-pinned layer adjacent to said AFM layer, said AP-pinned layer comprising;

a first ferromagnetic layer adjacent to said AFM layer;

a second ferromagnetic layer; and an antiparallel coupling (APC) layer disposed between said first ferromagnetic layer and said second ferromagnetic layer;

a ferromagnetic free layer comprising;

a third ferromagnetic layer;

a fourth ferromagnetic layer of material having an electrical resistivity greater than 400 $\mu$ohm-cm; and an APC layer disposed between said third and fourth ferromagnetic layers; and a spacer layer of nonmagnetic electrically conductive material disposed between said second ferromagnetic layer and said third ferromagnetic layer; and an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor caused by rotation of the magnetization axis of the AP-coupled free layer relative to the fixed magnetizations of the first and second pinned layers in response to magnetic fields from the magnetically recorded data.

37. The disk drive system as recited in claim 36 wherein said third ferromagnetic layer is made of Co—Fe.

38. The SV magnetoresistive sensor as recited in claim 36 wherein said third ferromagnetic layer is made of $Co_a$—$Fe_b$ in atomic percent, where $70\% \leq a \leq 95\%$, $5\% \leq b \leq 30\%$, and $a+b=100\%$.

39. The disk drive system as recited in claim 36 wherein the fourth ferromagnetic layer has the same thickness as the third ferromagnetic layer.

40. The magnetic read/write head as recited in claim 36 wherein said AFM layer is made of Pt—Mn.

41. The magnetic read/write head as recited in claim 36 wherein said spacer layer is made of copper (Cu).

42. A disk drive system comprising:

a magnetic recording disk;

a magnetic read/write head for magnetically recording data on the magnetic recording disk and for sensing magnetically recorded data on the magnetic recording disk, said magnetic read/write head comprising:

a write head including:

at least one coil layer and an insulation stack, the coil layer being embedded in the insulation stack;

first and second pole piece layers connected at a back gap and having pole tips with edges forming a portion of an air bearing surface (ABS); the insulation stack being sandwiched between the first and second pole piece layers; and a write gap layer sandwiched between the pole tips of the first and second pole piece layers and forming a portion of the ABS;

a read head including:

a spin valve (SV) magnetoresistive sensor disposed between first and second shield layers, the SV magnetoresistive sensor comprising:

an antiferromagnetic (AFM) layer;

an antiparallel (AP)-pinned layer adjacent to said AFM layer, said AP-pinned layer comprising;

a first ferromagnetic layer adjacent to said AFM layer;

a second ferromagnetic layer; and an antiparallel coupling (APC) layer disposed between said first ferromagnetic layer and said second ferromagnetic layer;

a ferromagnetic free layer comprising;

a third ferromagnetic layer;

a fourth ferromagnetic layer of high electrical resistivity material made of Co—Fe—Hf—O; and an APC layer disposed between said third and fourth ferromagnetic layers; and a spacer layer of nonmagnetic electrically conductive material disposed between said second ferromagnetic layer and said third ferromagnetic layer; and an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor caused by rotation of the magnetization axis of the AP-coupled free layer relative to the fixed magnetizations of the first and second pinned layers in response to magnetic fields from the magnetically recorded data.

43. The disk drive system as recited in claim 42 wherein said fourth ferromagnetic layer of Co—Fe—Hf—O has a composition of $(Co_{90}$—$Fe_{10})_{60}$—$Hf_{10}$—$O_{30}$ in atomic percent.

44. The disk drive system as recited in claim 42 wherein said fourth ferromagnetic layer of Co—Fe—Hf—O has a composition of $(Co_a$—$Fe_b)_x$—$Hf_y$—$O_z$ in atomic percent, where $40\% \leq x \leq 70\%$, $5\% \leq y \leq 25\%$, $20\% \leq z \leq 40\%$, $70\% \leq a \leq 95\%$, $5\% \leq b \leq 30\%$, $x+y+z=100\%$ and $a+b=100\%$.

* * * * *

UNITED STATES PATENT AND TRADEMARK OFFICE
CERTIFICATE OF CORRECTION

PATENT NO. : 6,538,859 B1
DATED : March 25, 2003
INVENTOR(S) : H. S. Gill

It is certified that error appears in the above-identified patent and that said Letters Patent is hereby corrected as shown below:

Column 13,
Delete lines 61-63.

Column 14,
Delete lines 1-2 and lines 41-52.
Line 40, ";" should be -- . --

Signed and Sealed this

Fourteenth Day of September, 2004

JON W. DUDAS
*Director of the United States Patent and Trademark Office*